United States Patent [19]
Takagi et al.

[11] Patent Number: 5,929,505
[45] Date of Patent: *Jul. 27, 1999

[54] INTER-METAL-WIRING ANTIFUSE DEVICE PROVIDED BY SELF-ALIGNMENT

[75] Inventors: Mariko Takagi; Ichiro Yoshii, both of Kawasaki, Japan

[73] Assignee: Kabushiki Kaisha Toshiba, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/522,654

[22] Filed: Sep. 1, 1995

[30] Foreign Application Priority Data

Sep. 6, 1994 [JP] Japan ................................. 6-212460

[51] Int. Cl.$^6$ ..................................................... H01L 29/00
[52] U.S. Cl. ............................ 257/528; 257/529; 257/530
[58] Field of Search .................................... 257/530, 529, 257/538

[56] References Cited

U.S. PATENT DOCUMENTS

| | | |
|---|---|---|
| 5,196,724 | 3/1993 | Gordon et al. . |
| 5,557,136 | 9/1996 | Gordon et al. ........................... 257/530 |
| 5,625,220 | 4/1997 | Liu et al. ................................. 257/530 |

FOREIGN PATENT DOCUMENTS

722513  1/1995  Japan .

*Primary Examiner*—William Mintel
*Attorney, Agent, or Firm*—Loeb & Loeb LLP

[57] ABSTRACT

A first electrode layer is formed on a semiconductor substrate, and surfaces other than a top surface thereof are buried in an insulation film, and the top surface makes the same surface as that of the insulation film. An antifuse insulation film is formed on a flat surface including the top surface of the first electrode layer. A second electrode layer is formed on the antifuse insulation film. An antifuse portion is formed by self-alignment at a cross point between the first and second electrode layers.

14 Claims, 5 Drawing Sheets

FIG. 8

INTER-METAL-WIRING ANTIFUSE DEVICE PROVIDED BY SELF-ALIGNMENT

BACKGROUND OF THE INVENTION

1. Field of the Invention

The present invention relates to a general semiconductor device and a method of manufacturing the same, and more specifically, to the structure of an antifuse device which can be electrically programmed, and a method of manufacturing the same.

2. Description of the Related Art

An antifuse device, which is recently focused one of the semiconductor devices, is a switch device which exhibits an electrically non-conductive state generally in an initial state, and is capable of shifting the non-conductive state to a conductive state irreversibly by use of an electrical method.

The antifuse device is used generally in an EPROM (electrically programmable ROM) or in an FPGA (field programmable gate array), which is a type of gate arrays.

An antifuse device usually includes a pair of electrodes formed on two wiring layers different from each other, and an insulating or high-resisting dielectric element inserted between these electrodes.

The dielectric element is programmed (shifting a non-conductive state to a conductive state by insulation breakdown) by applying a high voltage selectively to the electrodes, and wiring layers are electrically connected to each other.

Figure 1:
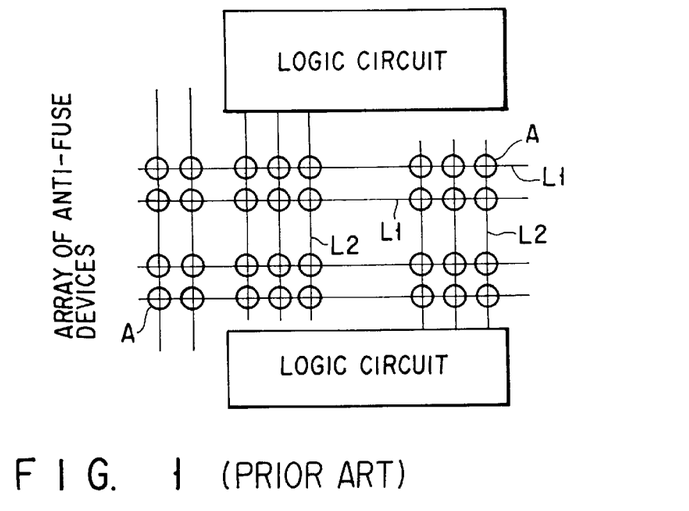
FIG. 1 is a circuit diagram showing an example of the conventional prior art antifuse device.
Figure 2:
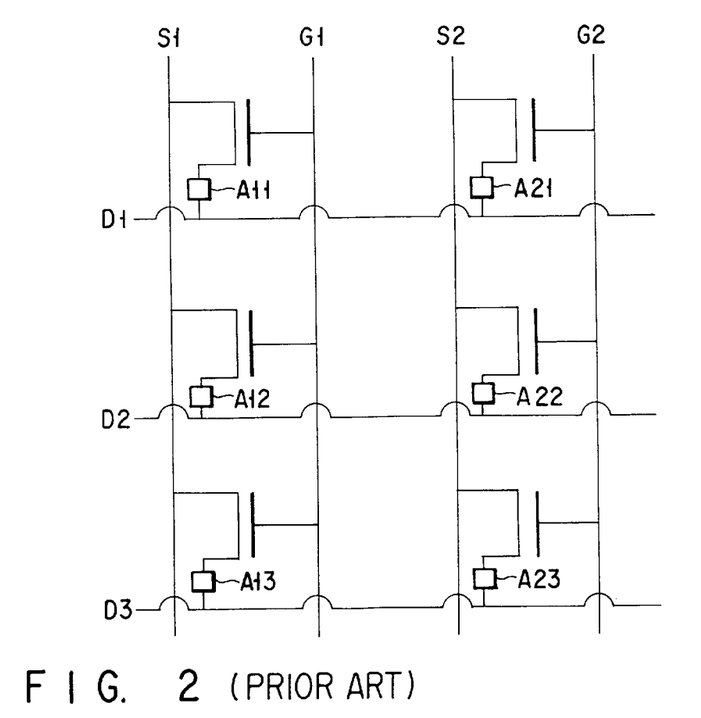
FIG. 2 is a circuit diagram showing an example of the conventional prior art antifuse device.

In the case where the antifuse is actually used in the above-mentioned EPROM or FPGA, a plurality of antifuse devices A are arranged in a matrix manner along wirings L1 and L2 provided normal to each other as shown in FIG. 1, or a plurality of antifuse devices A11–A13 and A21–A23 are arranged in a matrix manner set along wirings S1, G1, S2 and G2 with regard to D1, D2 and D3.

With this structure, the antifuse device functions as a parasitic resistance or capacity component, and influences on the circuit speed. Further, the antifuse serves to increase the area of the circuit, and influences on the circuit layout.

Under the above-described circumstances, it is required as the characteristics of the antifuse device that the preprogram capacity, the postprogram resistance (ON resistance), and the area of the device should be all sufficiently small.

It should be noted that an antifuse device can be made of various combinations of electrode materials and dielectric materials; however such various combinations can be categorized mainly into the following three groups:

(1) The type in which a high-concentration diffusion layer formed on a semiconductor substrate is used as a lower electrode;

(2) The type in which a high-concentration polysilicon is used as a lower electrode; and (3) A metal of Al, TiN, TiW, Mo or the like, formed in a layer located upper than the first Al wiring is used as a lower electrode.

Of these types, types (1) and (2) can be prepared generally by depositing an antifuse film at a high temperature, and therefore they are excellent in terms of the stability of the antifuse film; however their ON resistances are as high as several hundred Ω.

In contrast, with regard to type (3), the On resistance can be lowered to several hundred Ω.

Under these circumstances, since the low-resistance inter-metal-wiring antifuse is advantageous for a high-speed operation of the next generation, at present, the research and development of an inter-metal-wiring antifuse device is being progressed.

Some of the conventional inter-metal-layer antifuse elements will now be described with reference to FIGS. 3 and 4.

Figure 3:
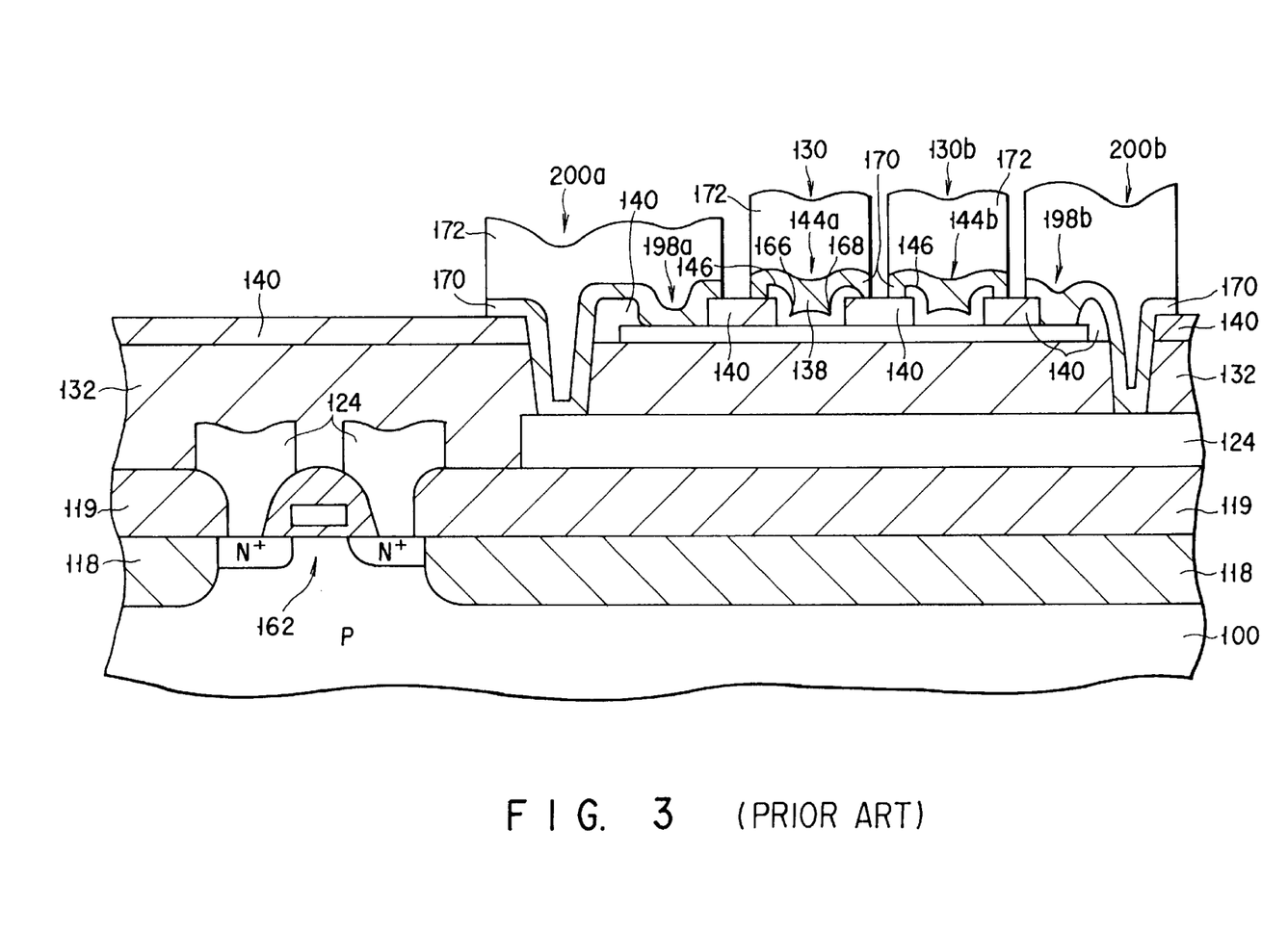
FIG. 3 is a cross section showing the structure of a conventional inter-metal-wiring antifuse device.

FIG. 3 shows a conventional inter-metal-wiring antifuse (which is disclosed in U.S. Pat. No. 5,196,724) used in an FPGA, and the content of this conventional art is as follows.

First, a transistor 162, interlayer insulation films 118 and 119 and a contact hole are formed on a silicon substrate 100 by a general CMOS process.

After that, aluminum is sputtered thereon to form a layer of about 600 nm, and then the layer is formed into a first aluminum wiring layer 124 by using a general lithography method and dry etching.

Subsequently, an insulation film is deposited, and then the insulation film is formed into a sufficiently smooth interlayer insulation layer 132 by a general resist etch back method.

Next, TiW is sputtered to formed a layer of 200 nm on the interlayer insulation film 132, and the layer is patterned in an antifuse formation region in a wiring manner in the direction parallel to the first aluminum wiring layer 124, into a TiW lower electrode wiring 138.

Subsequently, an insulation film 140 having a thickness of 300 nm is deposited, and antifuse vias 144a and 144b and regular vias 198a and 198b are formed at predetermined positions on the TiW lower electrode wiring 138.

After that, an amorphous silicon layer 146 having a thickness of 160 nm is deposited by the PECVD method, and this layer is patterned so that portions thereof remain only on the antifuse vias 144a and 144b.

Subsequently, a silicon oxide film having a thickness of 200 nm is deposited, and then this film is etched by the RIE method, to form spacers 166 and 168 on the side walls of the antifuse vias 144a and 144b.

Next, with use of the regular lithography method and the etching method, the insulation film 140 and the interlayer insulation film 132 are opened to form vias 200a and 200b both of which reach the first Al wiring layer 124.

It should be noted that the first Al wiring layer 124 and the TiW lower electrode wiring 38 are connected to each other by means of the vias 200a and 200b and the vias 198a and 198b.

After the formation of the vias 200a and 200b, a TiW layer 170 having a thickness of 200 nm and an Al layer 172 having a thickness of 800 nm are formed by sputtering, and then these layers are patterned by a general method into a second wiring layer and an upper electrode (not shown).

Thus, an FPGA having an inter-metal-wiring antifuse device is realized.

Figure 4:
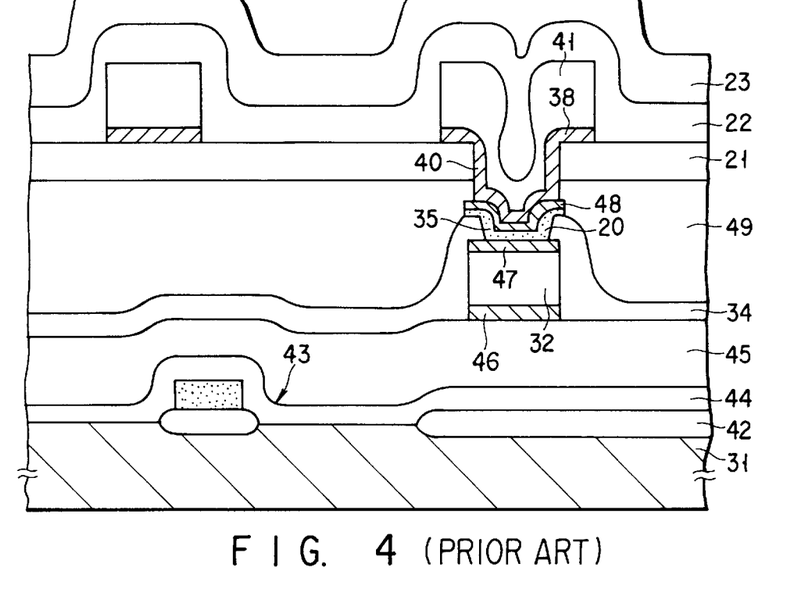
FIG. 4 is a cross section showing the structure of another conventional inter-metal-wiring antifuse device.

FIG. 4 shows another conventional inter-metal-layer antifuse device (disclosed in Jpn. Pat. Appln. KOKAI Publication No. 7-22513 by the same assignee as the present application), the content of this conventional art is as follows.

First, a transistor 43 and interlayer insulation films 44 and 45 are formed on a silicon substrate 31 by means of the regular CMOS process.

After that, a Ti/TiN layer 46 having a Ti portion 20 nm thick and a TiN portion 70 nm thick is formed by sputtering, an aluminum layer 32 having a thickness of 800 nm is formed by sputtering thereon, and a Ti/TiN layer 47 having a Ti portion 20 nm thick and a TiN portion 70 nm is formed by sputtering, thus forming a Ti/TiN/Al/Ti/TiN laminate (46, 32, 47).

This laminate is formed into a first wiring layer (46, 32, 47) by the general lithography method and the RIE method.

In a region where an antifuse device is formed, the laminate serves as an antifuse lower electrode.

Next, an SiO$_2$ insulation film 34 having a thickness of 400 nm is deposited by the PECVD, and the portion of the SiO$_2$ insulation film 34, which located on the antifuse region, is selectively etched by the regular lithography and the RIE, thus forming a tapered opening portion 35 (antifuse via).

Subsequently, an SiN layer having a thickness of 20 nm is deposited by the plasma CVD method, and then a TiN layer 48 having a thickness of 100 nm is formed thereon by sputtering.

After that, with use of the regular method, patterning is carried out so that the SiN layer 20 and the TiN layer 48 remain only in the antifuse region.

Next, for example, a TEOS oxide film is deposited, and after smoothing the TEOS oxide film by the resist etch back method, an interlayer insulation film 49 is deposited.

Then, an opening portion 40 is formed in the antifuse portion and the regular via portion by the regular lithography and the RIE method.

Subsequently, a Ti/TiN layer 38 serving as a barrier metal underneath the Al layer, and having a Ti portion 20 nm thick and a TiN portion 700 nm thick is formed by sputtering, and a second Al wiring layer 41 is formed thereon by sputtering.

The wiring layer is patterned into a second wiring layer by the regular method.

Further, via a passivation step, an FPGA is formed. In FIG. 4, each of the reference numerals 21, 22, and 23 denotes an insulation film.

However, with the structure of the first prior art example shown in FIG. 3, the following problems arise.

(1) Since the spacers 166 and 168 must be formed so that the amorphous silicon layer 146 serving as an antifuse film is deposited appropriately on the edge of the opening portion, the antifuse vias must be formed larger than usual by the portions of the spacers, thus decreasing the degree of integration as a whole circuit.

(2) Since the TiW lower electrode wiring 138 is provided between the first wiring layer and the second wiring layer, the thickness of the interlayer film between the first wiring layer and the TiW lower electrode wiring layer is decreased, and therefore it is expected that the short-yield of both layers should be lower than usual.

In other words, with the regular resist etch back method, only a limited smoothness can be obtained. For example, in the case of the structure disclosed in U.S. Pat. No. 5,196,724, it can be easily expected that the thickness of the interlayer between the first Al wiring layer 124 and the TiW lower electrode wiring 138, of the antifuse portion, should be remarkably thinner than that between the first Al wiring layer 124 and the second Al layer (not shown) of the transistor region.

In the case where the thickness of the interlayer insulation film between the first Al wiring layer 124 and the TiW lower electrode wiring layer 138 is set at the same as that of the insulation film between the first wiring layer and the second wiring layer of a general CMOS transistor, the insulation film between the first and second wiring layers of the FPGA (antifuse portion) becomes thicker than usual.

As a result, the via between the first and second wiring layers is deepened, and therefore the via yield is decreased as long as the via size is made larger than a regular CMOS.

In the case where the via size is made larger than the regular CMOS, it is only natural that the degree of integration is lowered.

Further, with this structure, a total of three masks, one for forming a special wiring layer, one for opening an antifuse hole, and the other one for patterning an antifuse material, are required, and therefore the processing cost is increased due to a total of three masks which are necessary, and an increase in the number of processing steps.

With the structure of the second prior art example shown in FIG. 4, the problem (2) can be solved since the TiW lower electrode wiring layer used in the first prior art example, and which is a wiring exclusively for an antifuse, is not present.

However, in the second prior art example, the process of forming an antifuse includes two steps each of which makes an opening in the antifuse portion. Therefore, a marginal area must be provided between the first wiring and the opening portion 5, and between the TiN layer 48 and the via 40, resulting in the lowering of the degree of integration.

In this case, the number of masks is increased by two, and although which is slightly better than the case of the first prior art example, the processing cost is increased.

As described above, the conventional proposed inter-metal-wiring antifuse device has a low wiring yield due to the formation of the special wiring layer for the antifuse.

Further, in the conventional antifuse portion, the wiring must be formed at a rule looser than the wiring rule for the regular CMOS transistor, thus lowering the degree of integration.

Further, in order to manufacture the conventional antifuse device, an increased number of masks are involved, thus raising the processing cost.

Therefore, the structure and processing of the conventional inter-metal-wiring antifuse device still need to be improved in terms of wiring yield, the degree of integration, and the cost, in the case where the device is actually applied to an FGPA or the like.

SUMMARY OF THE INVENTION

It is, therefore, an object of the present invention to provide a new and improved antifuse and method for manufacturing the same.

An inter-metal-wiring antifuse device in which a decrease in the wiring yield, a decrease in the degree of integration and an increase in production cost are suppressed as much as possible, and an integrated circuit in which such an inter-metal-wiring antifuse device is used, can be realized.

According to an aspect of the present invention, there is provided an antifuse device comprising:

a first electrode layer formed on a semiconductor substrate, surfaces other than a top surface of which are buried in an insulation layer and the top surface makes a same surface as that of the insulation layer;

an antifuse insulation film formed on a flat surface including the top surface of the first electrode layer; and a second electrode layer formed on the antifuse insulation film;

wherein an antifuse portion is formed at a cross point between the first and second electrode layers by self-alignment.

According to another aspect of the present invention, there is provided an antifuse device comprising:

a first electrode layer formed on a semiconductor substrate, surfaces other than a top surface of which are buried in an insulation layer and the top surface makes a same surface as that of the insulation layer;

an antifuse insulation film formed on a flat surface including the top surface of the first electrode layer; and a second electrode layer formed on the antifuse insulation film;

wherein an antifuse portion is formed at a cross point between the first and second electrode layers by self-alignment, in an integrated circuit along with other circuit elements.

According to another aspect of the present invention, there is provided a method of manufacturing an antifuse device, comprising the steps of:

forming a first electrode layer on a semiconductor substrate, surfaces other than a top surface of which are buried in an insulation layer and the top surface makes a same surface as that of the insulation layer;

forming an antifuse insulation film on a flat surface including the top surface of the first electrode layer; and forming a second electrode layer on the antifuse insulation film;

wherein an antifuse portion is formed at a cross point between the first and second electrode layers by self-alignment.

According to another aspect of the present invention, there is provided a method of manufacturing an antifuse device, comprising the steps of:

forming a first electrode layer on a semiconductor substrate, surfaces other than a top surface of which are buried in an insulation layer and the top surface makes a same surface as that of the insulation layer;

forming an antifuse insulation film on a flat surface including the top surface of the first electrode layer; and forming a second electrode layer on the antifuse insulation film;

wherein an antifuse portion is formed at a cross point between the first and second electrode layers by self-alignment, in an integrated circuit along with other circuit elements.

According to another aspect of the present invention, there is provided a method of manufacturing an antifuse device similar to the above, characterized in that the top surface of the first electrode layer is made the same as that of the insulation film by use of a chemical mechanical polishing method, in the step of forming the first electrode layer.

According to another aspect of the present invention, there is provided a method of manufacturing an antifuse device similar to the above, characterized in that the top surface of the first electrode layer is made the same as that of the insulation film with use of a buried wiring layer, in the step of forming the first electrode layer.

In the present invention, a complete smoothing method (for example, chemical mechanical polish: CMP), which is presently researched and developed as a feature standard processing technique, and a bury wiring method are used, and an inter-metal antifuse is formed by self-alignment; therefore a low-capacity and high-resistance inter-metal-wiring antifuse device and a method of manufacturing the same can be realized with the minimum rule of wiring being only 1/s and an increase in the number of masks by only one, without decreasing the wiring yield of the device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principle of the invention.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

Embodiments of the present invention will now be discussed in detail with reference to accompanying drawings.

Figure 5A:
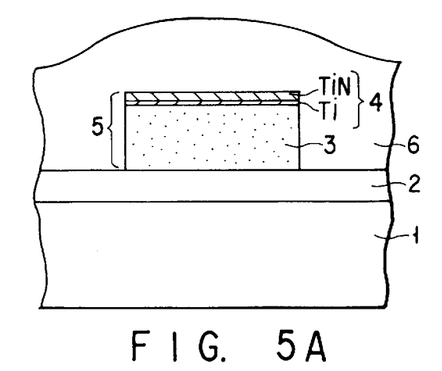
FIGS. 5A to 5C are cross sections showing the structure of an inter-metal-wiring antifuse device according to the present invention, and illustrating the method of manufacturing the same.
Figure 5B:
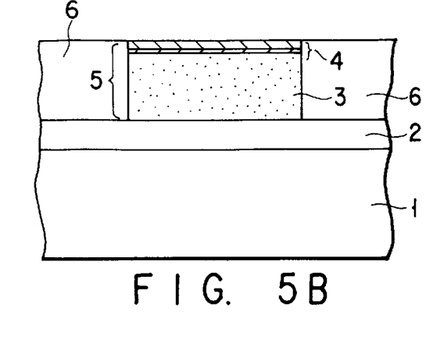
Figure 5C:
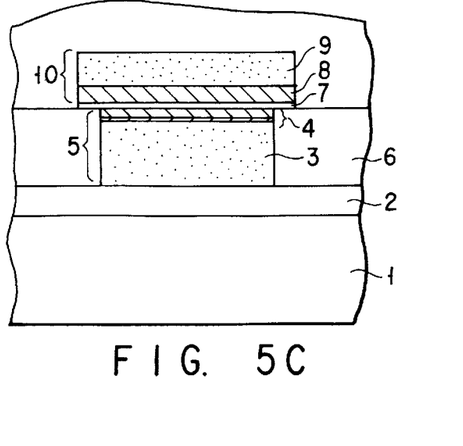

FIGS. 5A to 5C are cross sections showing the structure of an inter-metal-wiring antifuse device according to an embodiment of the present invention, and illustrating the method of manufacturing such a device.

As shown in FIG. 5A, an Al layer 3 having a thickness of 6000 angstrom is formed by sputtering on a sufficiently smooth silicon insulation film 1 formed on a semiconductor substrate 1, and subsequently, a hard metal layer, for example, an Ti/TTiN laminate layer 4 having a Ti portion 200 angstrom thick and a TTiN portion 700 angstrom thick, which is used as a preventer of an Al hillock and a stopper of the CMP which will be later described, is formed by sputtering.

Next, the Al/Ti/TiN laminate layers 3 and 4 are RIE-etched into a desired pattern by an ordinary lithography method with use of a resist as a mask, thus forming a first electrode (wiring) layer 5.

Further, the Al/Ti/TiN laminated layers 3 and 4 serve also as a lower electrode of the antifuse portion in the antifuse forming region.

After that, an insulation film 6, a typical example of which is a TEOS oxide film, having a thickness of 8000 angstrom, is deposited.

This insulation film 6 is polished until it is sufficiently smooth by the chemical mechanical polish (CMP) method.

When the polishing is carried out until the surface of the Ti/TiN laminate layer 4 of the first wiring layer 5 appears, the structure shown in FIG. 5B, that is, the first wiring layer 5 is embedded in the insulation film 6, is obtained.

After that, as shown in FIG. 5C, an antifuse film, for example, a silicon nitride film 7 having a thickness of 200 angstrom is deposited by the PECVD method. Subsequently, a TiN layer 8 having a thickness of 1000 angstrom and serving as a barrier metal layer is formed by sputtering, and an Al layer 9 having a thickness of 2000 angstrom is formed by sputtering.

The laminate of the silicon nitride film/TiN/Al wiring layers 7, 8 and 9 is RIE-etched by the ordinary lithography method with use of a resist as a mask, into a pattern which is normal to the first wiring layer 5, thus forming a second electrode (wiring) layer 10.

The second wiring layer 10 serves also as an upper electrode of the antifuse portion.

Further, a passivation (protection) 14 is deposited.

As described above, the antifuse portion is formed by self-alignment at the cross point between the first wiring layer 5 and the second wiring layer 10.

Naturally, in order to achieve the structure shown in FIG. 5B, a bury wiring method may be used in place of the above-described technique.

Furthermore, in order to increase manufacturing yield of the antifuse device shown in FIGS. 5A, 5B and 5C, overall the first wiring layer 5 or TiN layer of the most upper layer in the first wiring layer 5 may be used W in place of the above-described structure.

That is to say, since the upper surface of the first wiring layer 5 is sufficiently smoothed by using W, the manufacturing yield of the antifuse device formed on the upper surface of the first wiring layer 5 is increased.

FIGS. 6A, 6B to FIG. 8 show the cases where inter-metal-layer antifuse devices having the structures shown in FIG. 5A to 5C are used in integrated circuits (LS1).

Figure 6A:
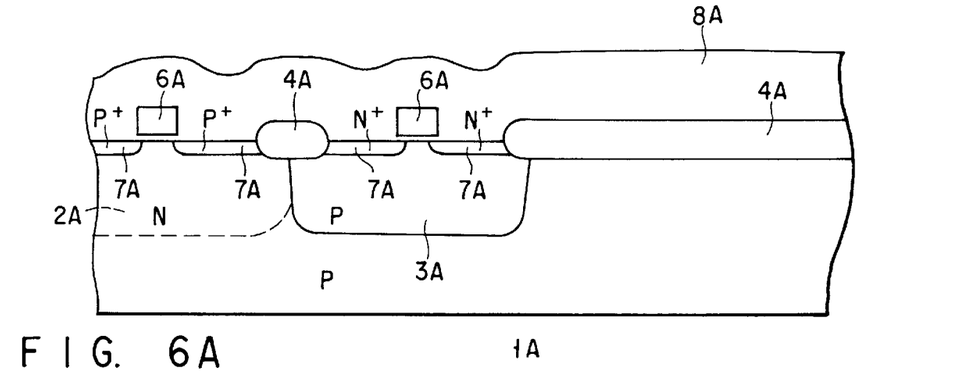
FIGS. 6A and 6B are cross sections showing the structure in which an antifuse device according to the present invention is used in an integrated circuit, and illustrating the method of manufacturing the same.

FIG. 6A shows a so-called CMOS field effect transistor, obtained, for example, by forming an N-well 2A, a P-well 3A, an element separation field oxide film 4A, an I/I (ion implanter insulator) for preventing the field inversion, an I/I for adjusting the threshold for a transistor, an I/I for preventing a punch-through, a gate oxide film 5A, a gate electrode 6A and a diffusion layer 7A on a P-type silicon substrate 1A, using an ordinary CMOS process, and further the figure shows a state in which the deposition of an interlayer insulation film 8A using CVD-SiO$_2$ and BPSG has been completed.

Figure 6B:
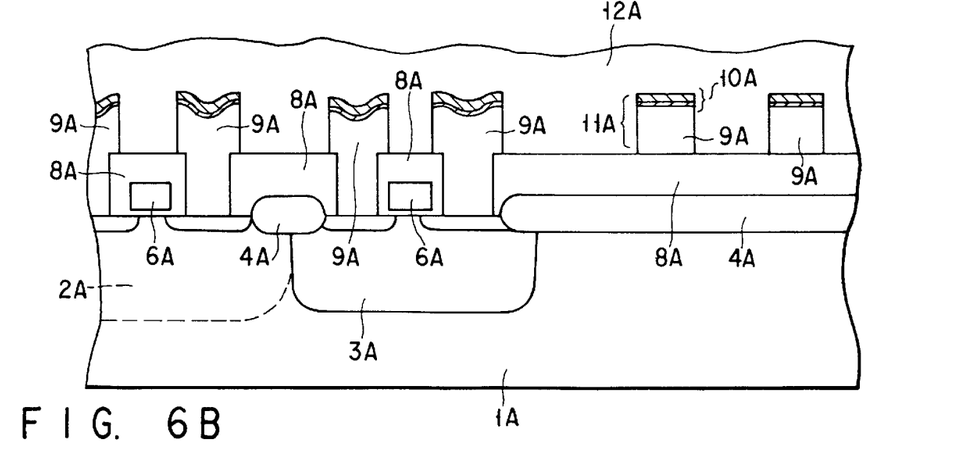

Subsequently, an interlayer insulation film 8A is sufficiently smoothed by using the above-described CMP method as shown in FIG. 6B.

Next, a contact hole is opened in the diffusion layer region of the transistor by use of an ordinary lithography and etching.

After that, an Al film 9A having a thickness of 6000 angstrom is formed on the interlayer insulation film 8A by sputtering, and then a hard metal layer, for example, a Ti/TiN laminate layer 10A having a Ti portion 200 thick and a TiN portion 700 thick, and used for preventing an Al hillock and stopping the later-described CMP, is formed by sputtering.

The laminate of the Al/Ti/TiN layers 9A and 10A is RIE-etched by the ordinary lithography method with use of a resist as a mask, into a pattern, thus forming a first electrode (wiring) layer 11A.

The laminate of the Al/Ti/TiN layer 9A and 10A serves also as a lower electrode of the antifuse portion in the antifuse forming region.

After that, an insulation film 12A, a typical example of which is a TEOS oxide film, having a thickness of about 8000 angstrom, is formed by deposition (FIG. 6B).

The insulation film 12A is polished by the CMP method.

Figure 7A:
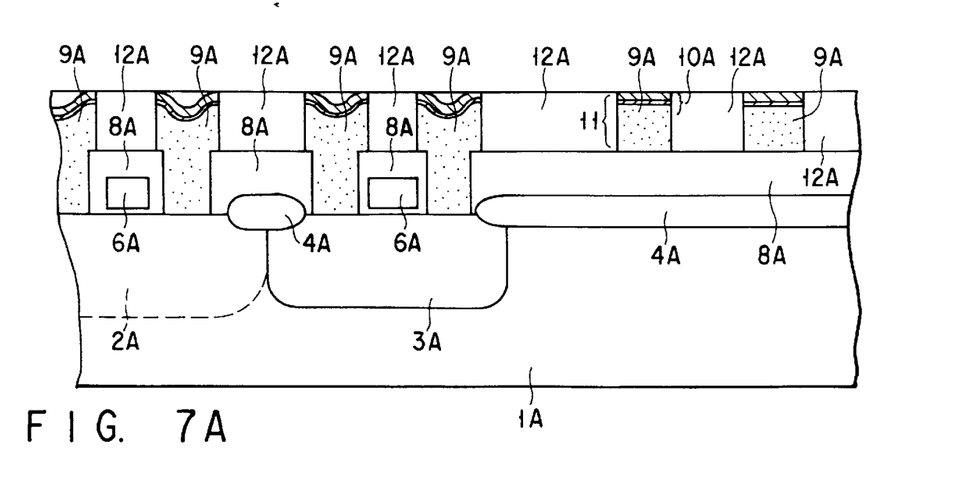
FIGS. 7A and 7B are cross sections showing the structure in which an antifuse device according to the present invention is used in an integrated circuit, and illustrating the method of manufacturing the same.

When the polishing is carried out until the surface of the Ti/TiN laminate layer 10A of the first wiring layer 11A appears, the structure shown in FIG. 7A, that is, the first wiring layer 11A is embedded in the insulation film 12A, is obtained.

Figure 7B:
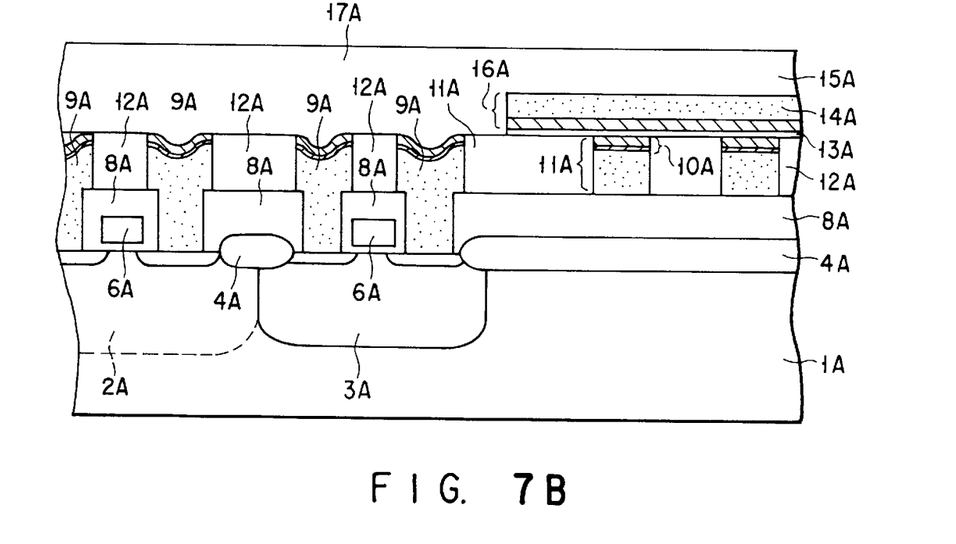

After that, as shown in FIG. 7B, an antifuse film, for example, a silicon nitride film 13A having a thickness of 200 angstrom is deposited by the PECVD method. Subsequently, a TiN layer 14A having a thickness of about 1000 angstrom and serving as a barrier metal layer is formed by sputtering, and an Al layer 15A having a thickness of 2000 angstrom is formed by sputtering.

The laminate of the silicon nitride film/TiN/Al wiring layers 13A, 14A and 15A is RIE-etched by the ordinary lithography method with use of a resist as a mask, into a pattern which is situated in the antifuse forming region and is normal to the first wiring layer 11A, thus forming an antifuse wiring layer 16A.

The antifuse wiring layer 16A serves also as an upper electrode of the antifuse portion.

As described above, the antifuse portion is formed by self-alignment at the cross point between the first wiring layer 11A and the antifuse wiring layer 16A.

After that, an insulation film 17A, a typical example of which is a TEOS oxide film, having a thickness of about 12000 angstrom, is formed by deposition.

The insulation film 17A is smoothed by, for example, the resist etch back method so that a portion having a thickness of about 6000 angstrom remains on the antifuse wiring layer 16A in the antifuse region and a portion having a thickness of about 8000 angstrom remains on the first wiring layer 11A in the diffusion layer region (FIG. 7B).

Naturally, in the above smoothing process, the CMP method described above may be used.

Figure 8:
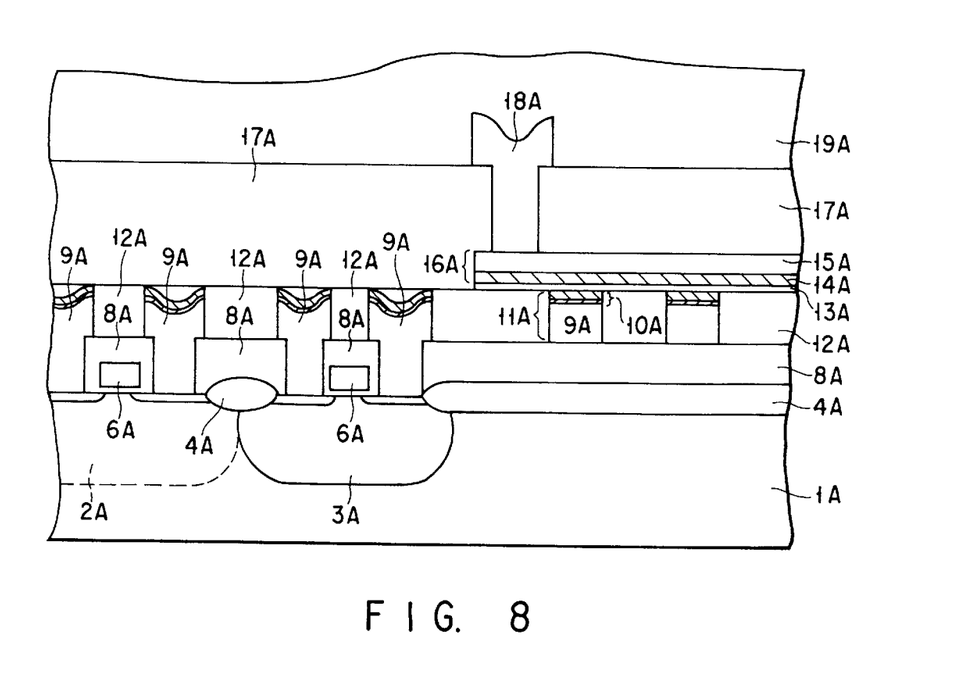
FIG. 8 is a cross section showing the structure in which an antifuse device according to the present invention is used in an integrated circuit, and illustrating the method of manufacturing the same.

Subsequently, a via-hole is formed at a predetermined position of each of the antifuse wiring layer 16A and the first wiring layer 11A by use of an ordinary lithography and an etching method as shown in FIG. 8.

After a while, an Al layer 18A having a thickness of 8000 angstrom is formed by sputtering, and the Al layer is RIE-etched by an ordinary lithography method with use of a resist as a mask, thus forming a second wiring layer 18A.

After that, ordinary processing steps for the passivation layer 19A are carried out (FIG. 8).

As described above, according to the present invention, an LSI having an antifuse portion can be formed with an increase in the number of masks by only one as compared to the conventional technique, without using a special wiring layer, can be formed.

Further, the antifuse portion is formed by self-alignment, the degree of integration is improved more than that of the conventional technique.

The upper surface of the interlayer insulation film 8A which constitutes the first wiring layer 11A, is sufficiently smoothed in advance, and therefore, even if an antifuse wiring layer is formed in the middle of an ordinary laminate of the first and second wiring layers, an decrease in yield, such as of via, does not occur, unlike in the conventional technique.

Thus, according to the present invention, there can be provided an inter-metal-wiring antifuse in which an increase in wiring yield, an decrease in the degree of integration and the production cost are suppressed as much as possible, and an antifuse device structure for realizing an integrated circuit in which such an inter-metal-wiring antifuse is used, and the method of manufacturing such a structure.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. An antifuse device comprising:
   a first electrode layer formed on a semiconductor substrate, surfaces other than a top surface of which are buried in an insulation layer and the top surface makes a same surface as a surface of the insulation layer, so that the top surface of the first electrode and the surface of the insulation layer together define a first surface;
   a flat antifuse insulation film formed on a flat surface including the first surface of said first electrode layer and said insulation layer, and
   a second electrode layer formed on said flat antifuse insulation film;
   wherein an antifuse portion is formed at a cross point between said first and second electrode layers by self-alignment and the cross point between said antifuse insulation layer and said first electrode layer is directly obtained without forming a via.

2. An antifuse device comprising:
   a first electrode layer formed on a semiconductor substrate, surfaces other than a top surface of which are buried in an insulation layer and the top surface of said first electrode is coplanar with a flat surface of the insulation layer;
   a flat antifuse insulation film formed on the flat surface including the top surface of said first electrode layer the flat surface of the insulation layer; and
   a second electrode layer formed on said flat antifuse insulation film;
   wherein an antifuse portion is formed at a cross point between said first and second electrode layers by self-alignment, in an integrated circuit along with other circuit elements.

3. An antifuse device according to claim 1, wherein said first electrode layer includes an Al layer formed on a sufficiently smooth silicon insulation film formed on said semiconductor substrate, and a Ti/TiN laminate layer formed on the Al layer.

4. An antifuse device according to claim 3 wherein said insulation layer includes a TEOS oxide film formed on the sufficiently smooth silicon insulation film.

5. An antifuse device according to claim 4, wherein said antifuse insulation film includes a silicon nitride film.

6. An antifuse device according to claim 5, wherein said second electrode layer includes a TiN/Al laminate layer formed on said silicon nitride film by patterning so as to be normal to the first electrode layer.

7. An antifuse device according to claim 2, wherein said other circuit elements include field effect transistors formed on a P-type silicon substrate.

8. An antifuse device according to claim 7, wherein said first electrode layer includes an Al/Ti/TiN laminate layer formed on an interlayer insulation film formed on said P-type silicon substrate.

9. An antifuse device according to claim 8, wherein said insulation layer includes a TEOS oxide film formed on the sufficiently smooth silicon insulation film.

10. An antifuse device according to claim 9, wherein said antifuse insulation film includes a silicon nitride film.

11. An antifuse device according to claim 6, wherein said silicon nitride film is patterned along with the TiN/Al laminate layer formed on said silicon nitride film, so as to be normal to said first electrode layer, thus forming an antifuse wiring layer.

12. An antifuse device according to claim 11, wherein said second electrode layer is formed via the insulation film including the TEOS oxide film formed on said antifuse wiring layer.

13. An antifuse device according to claim 2, wherein a wiring of the integrated circuit and that of the antifuse device are commonly formed.

14. An antifuse device according to claim 2, wherein an interlayer insulation film of the integrated circuit and that of the antifuse device are commonly formed.

* * * * *